(12) United States Patent
Parthasarathy et al.

(10) Patent No.: US 8,399,907 B2
(45) Date of Patent: Mar. 19, 2013

(54) VTS INSULATED GATE BIPOLAR TRANSISTOR

(75) Inventors: Vijay Parthasarathy, Mountain View, CA (US); Sujit Banerjee, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 7 days.

(21) Appl. No.: 13/200,793

(22) Filed: Sep. 30, 2011

(65) Prior Publication Data

US 2012/0061720 A1 Mar. 15, 2012

Related U.S. Application Data

(60) Division of application No. 12/317,294, filed on Dec. 23, 2008, now Pat. No. 8,093,621, which is a continuation of application No. 11/589,124, filed on Oct. 27, 2006, now Pat. No. 8,026,568.

(51) Int. Cl.
*H01L 29/739* (2006.01)

(52) U.S. Cl. ........ 257/133; 257/287; 257/565; 257/578; 257/E21.38; 257/E29.198

(58) Field of Classification Search .................. 257/129, 257/139, 327–334, 500, 578, E31.138, E29.201, 257/E29.262, E29.257, E21.384, 287, 341, 257/565, E29.198, 133, E32.138; 438/138, 438/141
See application file for complete search history.

(56) References Cited

U.S. PATENT DOCUMENTS

| | | | |
|---|---|---|---|
| 4,769,685 A | 9/1988 | MacIver et al. | |
| 5,008,794 A | 4/1991 | Leman | |
| 5,072,268 A | 12/1991 | Rumennik | |
| 5,164,891 A | 11/1992 | Keller | |
| 5,258,636 A | 11/1993 | Rumennik et al. | |
| 5,274,259 A | 12/1993 | Grabowski et al. | |
| 5,285,367 A | 2/1994 | Keller | |
| 5,313,082 A | 5/1994 | Eklund | |
| 5,323,044 A | 6/1994 | Rumennik et al. | |
| 5,411,901 A | 5/1995 | Grabowski et al. | |
| 6,084,277 A | 7/2000 | Disney et al. | |
| 6,168,983 B1 | 1/2001 | Rumennik et al. | |
| 6,207,994 B1 | 3/2001 | Rumennik et al. | |

(Continued)

FOREIGN PATENT DOCUMENTS

| | | |
|---|---|---|
| DE | 19905421 | 8/2000 |
| EP | 0494597 | 7/1992 |

(Continued)

OTHER PUBLICATIONS

Baliga: "Power Semiconductor Devices," PWS Publishing Company, USA, Dec. 31, 1996, pp. 428-429, XP002686055.

(Continued)

*Primary Examiner* — Teresa M Arroyo
*Assistant Examiner* — Whitney T Moore
(74) *Attorney, Agent, or Firm* — The Law Offices of Bradley J. Bereznak

(57) ABSTRACT

In one embodiment, a power transistor device comprises a substrate that forms a PN junction with an overlying buffer layer. The power transistor device further includes a first region, a drift region that adjoins a top surface of the buffer layer, and a body region. The body region separates the first region from the drift region. First and second dielectric regions respectively adjoin opposing lateral sidewall portions of the drift region. The dielectric regions extend in a vertical direction from at least just beneath the body region down at least into the buffer layer. First and second field plates are respectively disposed in the first and second dielectric regions. A trench gate that controls forward conduction is disposed above the dielectric region adjacent to and insulated from the body region.

12 Claims, 6 Drawing Sheets

U.S. PATENT DOCUMENTS

| | | |
|---|---|---|
| 6,424,007 B1 | 7/2002 | Disney |
| 6,465,291 B1 | 10/2002 | Disney |
| 6,468,847 B1 | 10/2002 | Disney |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,552,597 B1 | 4/2003 | Disney |
| 6,555,873 B2 | 4/2003 | Disney et al. |
| 6,555,883 B1 | 4/2003 | Disney et al. |
| 6,563,171 B2 | 5/2003 | Disney |
| 6,570,219 B1 | 5/2003 | Rumennik et al. |
| 6,573,558 B2 | 6/2003 | Disney |
| 6,583,663 B1 | 6/2003 | Disney |
| 6,633,065 B2 | 10/2003 | Rumennik et al. |
| 6,635,544 B2 | 10/2003 | Disney |
| 6,639,277 B2 | 10/2003 | Rumennik et al. |
| 6,667,213 B2 | 12/2003 | Disney |
| 6,680,646 B2 | 1/2004 | Disney |
| 6,683,344 B2 | 1/2004 | Tsukanov et al. |
| 6,724,041 B2 | 4/2004 | Rumennik et al. |
| 6,730,585 B2 | 5/2004 | Disney |
| 6,734,714 B2 | 5/2004 | Disney |
| 6,750,105 B2 | 6/2004 | Disney |
| 6,759,289 B2 | 7/2004 | Disney |
| 6,768,171 B2 | 7/2004 | Disney |
| 6,768,172 B2 | 7/2004 | Rumennik et al. |
| 6,777,749 B2 | 8/2004 | Rumennik et al. |
| 6,781,198 B2 | 8/2004 | Disney |
| 6,787,437 B2 | 9/2004 | Rumennik et al. |
| 6,787,847 B2 | 9/2004 | Disney et al. |
| 6,798,020 B2 | 9/2004 | Disney et al. |
| 6,800,903 B2 | 10/2004 | Rumennik et al. |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,987,299 B2 | 1/2006 | Disney et al. |
| 7,115,958 B2 | 10/2006 | Disney et al. |
| 7,135,748 B2 | 11/2006 | Balakrishnan |
| 7,220,629 B2 | 5/2007 | Balakrishnan |
| 7,221,011 B2 | 5/2007 | Banerjee et al. |
| 7,253,042 B2 | 8/2007 | Disney |
| 7,253,059 B2 | 8/2007 | Balakrishnan |
| 7,335,944 B2 | 2/2008 | Banerjee |
| 7,381,618 B2 | 6/2008 | Disney |
| 7,391,088 B2 | 6/2008 | Balakrishnan |
| 7,459,366 B2 | 12/2008 | Banerjee |
| 7,468,536 B2 | 12/2008 | Parthasarathy |
| 7,494,875 B2 | 2/2009 | Disney |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,648,879 B2 | 1/2010 | Banerjee et al. |
| 7,732,860 B2 | 6/2010 | Parthasarathy et al. |
| 7,745,291 B2 | 6/2010 | Disney |
| 7,786,533 B2 | 8/2010 | Disney |
| 7,791,132 B2 | 9/2010 | Banerjee et al. |
| 7,816,731 B2 | 10/2010 | Parthasarathy |
| 7,829,944 B2 | 11/2010 | Disney |
| 7,859,037 B2 | 12/2010 | Parthasarathy et al. |
| 7,863,172 B2 | 1/2011 | Zhu |
| 7,871,882 B2 | 1/2011 | Parthasarathy |
| 7,875,962 B2 | 1/2011 | Balakrishnan |
| 7,893,754 B1 | 2/2011 | Kung |
| 7,964,912 B2 | 6/2011 | Parthasarathy |
| 2002/0074585 A1 | 6/2002 | Tsang et al. |
| 2003/0042537 A1 | 3/2003 | Nakamura et al. |
| 2003/0136974 A1 | 7/2003 | Yedinak et al. |
| 2003/0209781 A1 | 11/2003 | Hattori |
| 2004/0063269 A1 | 4/2004 | Kocon |
| 2004/0097042 A1 | 5/2004 | Hshieh et al. |
| 2005/0145977 A1 | 7/2005 | Alessandria et al. |
| 2005/0167749 A1 | 8/2005 | Disney |
| 2005/0263852 A1 | 12/2005 | Ogura et al. |
| 2007/0138547 A1 | 6/2007 | Nakamura |
| 2007/0200183 A1 | 8/2007 | Rueb et al. |
| 2007/0272953 A1 | 11/2007 | Hirler |
| 2008/0150020 A1 | 6/2008 | Challa et al. |
| 2008/0164520 A1 | 7/2008 | Darwish |
| 2008/0197406 A1 | 8/2008 | Parthasarathy et al. |

FOREIGN PATENT DOCUMENTS

| | | |
|---|---|---|
| EP | 1959499 | 8/2008 |
| JP | 2000349288 | 12/2000 |
| JP | 2001085688 | 3/2001 |
| JP | 2003243655 | 8/2003 |

OTHER PUBLICATIONS

Khanna: "IGBT Theory and Design," Wiley Interscience, USA, Dec. 31, 2003, pp. 12-13 & 38-45, XP002686056 & XP002686057.

VTS INSULATED GATE BIPOLAR TRANSISTOR

This application is a division of application Ser. No. 12/317,294 filed Dec. 23, 2008, now U.S. Pat. No. 8,093,621 which is a continuation of application Ser. No. 11/589,124 filed Oct. 27, 2006 now U.S. Pat. No. 8,026,568, which is assigned to the assignee of the present application.

TECHNICAL FIELD

The present disclosure relates to power semiconductor device structures and processes for fabricating high-voltage transistors.

BACKGROUND

High-voltage, field-effect transistors (HVFETs) and other varieties of high voltage power semiconductor devices are well known in the semiconductor arts. Many HVFETs employ a device structure that includes a lightly-doped extended drain region that supports or blocks the applied high-voltage (e.g., several hundred volts) when the device is in the "off" state. Because of the high-resistivity epitaxial layer, the "on" state drain-source resistances ($R_{DS(on)}$) of ordinary MOSFET power devices operating at high voltages (e.g., 500-700V or higher) is typically large, especially at high drain currents. For instance, in a traditional power MOSFET the lightly-doped extended drain region, also referred to as the drift zone, is typically responsible for 95% of total on-state resistance of the transistor.

To combat the conduction loss problem, various alternative design structures have been proposed. For example, in the vertical, thin silicon (VTS) MOSFET the conduction loss is lowered by employing a graded doping profile in a thin silicon layer which is depleted by a field plate embedded in an adjacently located thick oxide. One problem with the VTS structure, however, is the relatively large output capacitance (Coss) caused by the large field plate (coupled to the source terminal) to silicon pillar (coupled to the drain termainal) overlap. This relatively large output capacitance limits the high frequency switching performance of the device. Another drawback to the traditional VTS MOSFET structure is the need for a linearly-graded doping profile in the vertical direction through the drift regions, which is often difficult to control and costly to manufacture.

In another approach, known as the CoolMOS® concept, conduction loss is reduced by alternating N– and P– reduced surface field (RESURF) layers. In a CoolMOS® device electrical conductivity is provided by majority carriers only; that is, there is no bipolar current (minority carrier) contribution. Due to the fact that the CoolMOS® high-voltage power MOSFET design does not include a large trench field plate structure, it also benefits from a relatively low Coss. Nevertheless, in certain applications the CoolMOS® design still suffers from unacceptably high conductivity losses.

The insulated-gate bipolar transistor, or IGBT, is a minority carrier power semiconductor device that achieves relatively low conduction losses through a FET control input in combination with a bipolar power switching transistor in a single device structure. The main drawback of the IGBT design, however is that switching frequency is typically limited to 60 KHz or lower due to a characteristic "tail current" resulting from minority carrier buildup in the epitaxial drift region. Stated differently, switching losses caused by poor switching performance at higher frequencies (100 KHz or higher) remains problematic. Attempts aimed at improving the switching speed of the IGBT design include the use of ultra-thin wafer (~75 μm or less) non-punchthrough structures. But ultra-thin wafer processing comes with significant cost addition and added complexity in fabrication processing.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
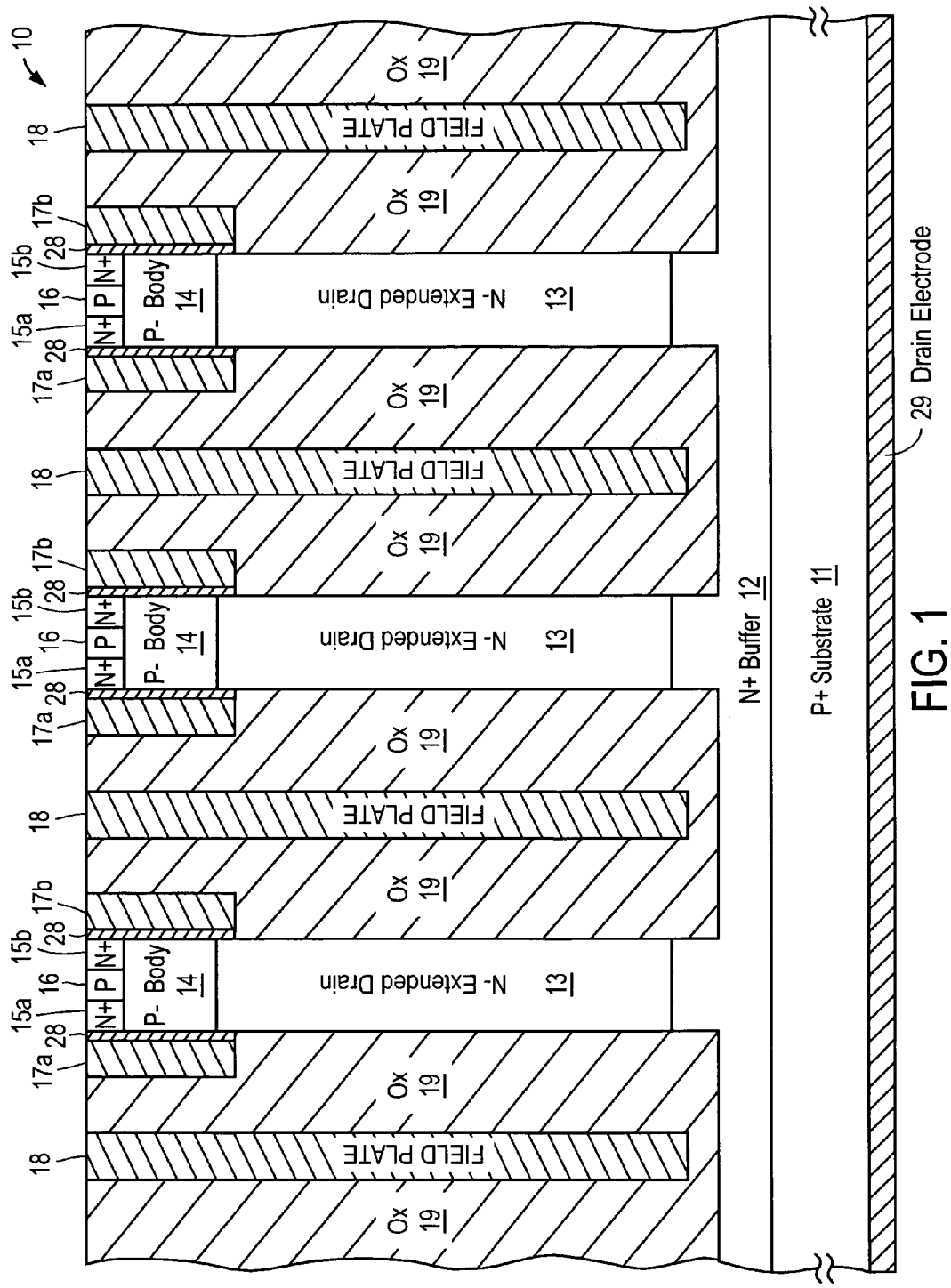
FIG. 1 illustrates an example cross-sectional side view of a vertical thin silicon (VTS) insulated gate bipolar transistor (IGBT) structure.

FIG. 1 illustrates an example cross-sectional side view of a VTS IGBT 10 having a structure that includes a plurality of segregated extended drain regions 13 of N-type silicon formed above a P+ doped silicon substrate 11. In the example of FIG. 1, extended drain regions 13 are separated from P+ substrate 11 by a heavily-doped N+ buffer layer 12. In one embodiment, extended drain regions 13 are part of an epitaxial layer that extends from N+ buffer layer 12 to a top surface of the silicon wafer. Substrate 11 is heavily doped to minimize its resistance to current flowing through to the drain electrode 29, which is located on the bottom of substrate 11 in the completed device.

VTS IGBT 10 also includes P-body regions 14. A pair of N+ doped source regions 15a & 15b are laterally separated by a P-type region 16 at the top surface of the wafer's epitaxial layer above each P-body region 14. As can be seen, each P-body region 14 is disposed directly above and vertically separates a corresponding one of the extended drain regions 13 from N+ source regions 15a & 15b and P-type region 16. The device structure of FIG. 1 further includes a trench gate structure having a gate 17 (comprised, for example, of polysilicon), and a gate-insulating layer 28 that insulates gate 17 from the adjacent sidewall P-body regions 14. Gate-insulating layer 28 may comprise thermally-grown silicon dioxide or another appropriate dielectric insulating material. In a completely manufactured device, application of an appropriate voltage potential to gate 17 causes a conductive channel to be formed along the vertical sidewall portion of P-body regions 14 such that current may flow vertically through the semiconductor material, i.e., from P+ substrate 11 up through buffer layer 12 and extended drain regions 13, through the vertically-formed conduction channel to a top surface of the silicon wafer where source regions 15 are disposed.

In another embodiment, instead of arranging P+ region 16 between N+ source regions 15a & 15b across the lateral width of the semiconductor pillar (as shown in FIG. 1), N+ source regions 15 and P+ regions may be alternately formed at the top of each pillar across the lateral length (i.e., into and out of the page of the illustrative figures) of each pillar. In other words, a given cross-sectional view such as that shown in FIG. 1 would have either an N+ source region 15, or a P+ region 16, that extends across the full lateral width of pillar 17, depending upon where the cross-section is taken. In such an embodiment, each N+ source region 15 is adjoined on both sides (along the lateral length of the pillar) by P+ regions 16. Similarly, each P+ region 16 is adjoined on both sides (along the lateral length of the pillar) by N+ source regions 15.

Practitioners in the art will appreciate that P+ substrate 11 also functions as the P+ emitter layer of a vertical PNP bipolar junction transistor. Expressed in fundamental terms, VTS IGBT 10 comprises a semiconductor device with four layers of alternating PNPN conductivity type (P+ substrate 11—N+ buffer layer 12 & N− extended drain regions 13—P-Body regions 14—N+ source regions 15) that is controlled by the trench gate MOSFET structure described above. Practitioners in the art will further appreciate that the inclusion of N+ buffer layer 12 advantageously prevents the off-state depletion layer formed in drift regions 13 from reaching the P+ emitter (substrate) layer 11 during high voltage blocking.

Extended drain regions 13, P-body regions 14, source regions 15a & 15b and P+ regions 16 collectively comprise a mesa or pillar (both terms are used synonymously in the present application) of silicon material in the example device structure of FIG. 1.

As will be described below in conjunction with FIGS. 2A-2F, the pillars are defined by vertical trenches formed by selective removal of regions of semiconductor material on opposite sides of each pillar or mesa. The height and width of each of the pillars, as well as the spacing between adjacent vertical trenches may be determined by the breakdown voltage requirements of the device. In various embodiments, the pillars have a vertical height (thickness) in a range of about 30 μm to 120 μm thick. For example, a VTS IGBT formed on a die approximately 1 mm×1 mm in size may have a pillar with a vertical thickness of about 60 μm. By way of further example, a transistor structure formed on a die of about 2 mm-4 mm on each side may have a pillar structure of approximately 30 μm thick. In certain embodiments, the lateral width of each pillar is as narrow as can be reliably manufactured (e.g., about 0.4 μm to 0.8 μm wide) in order to achieve a very high breakdown voltage (e.g., 600-800V).

Adjacent pairs of pillars (which comprise N− extended drain regions 13) are shown separated in the lateral direction by a deep trench dielectric region 19. Dielectric regions 19 may comprise silicon dioxide, silicon nitride, or other suitable dielectric materials. Following formation of the deep trenches, dielectric regions 19 may be formed using a variety of well-known methods, including thermal growth and chemical vapor deposition. In the example of FIG. 1, each of dielectric regions 19 extend from just beneath gate 17 down into N+ buffer layer 12. In other words, in the embodiment shown, dielectric regions 19 extend substantially vertically through the entire vertical thickness of drift regions 13.

Figure 3:
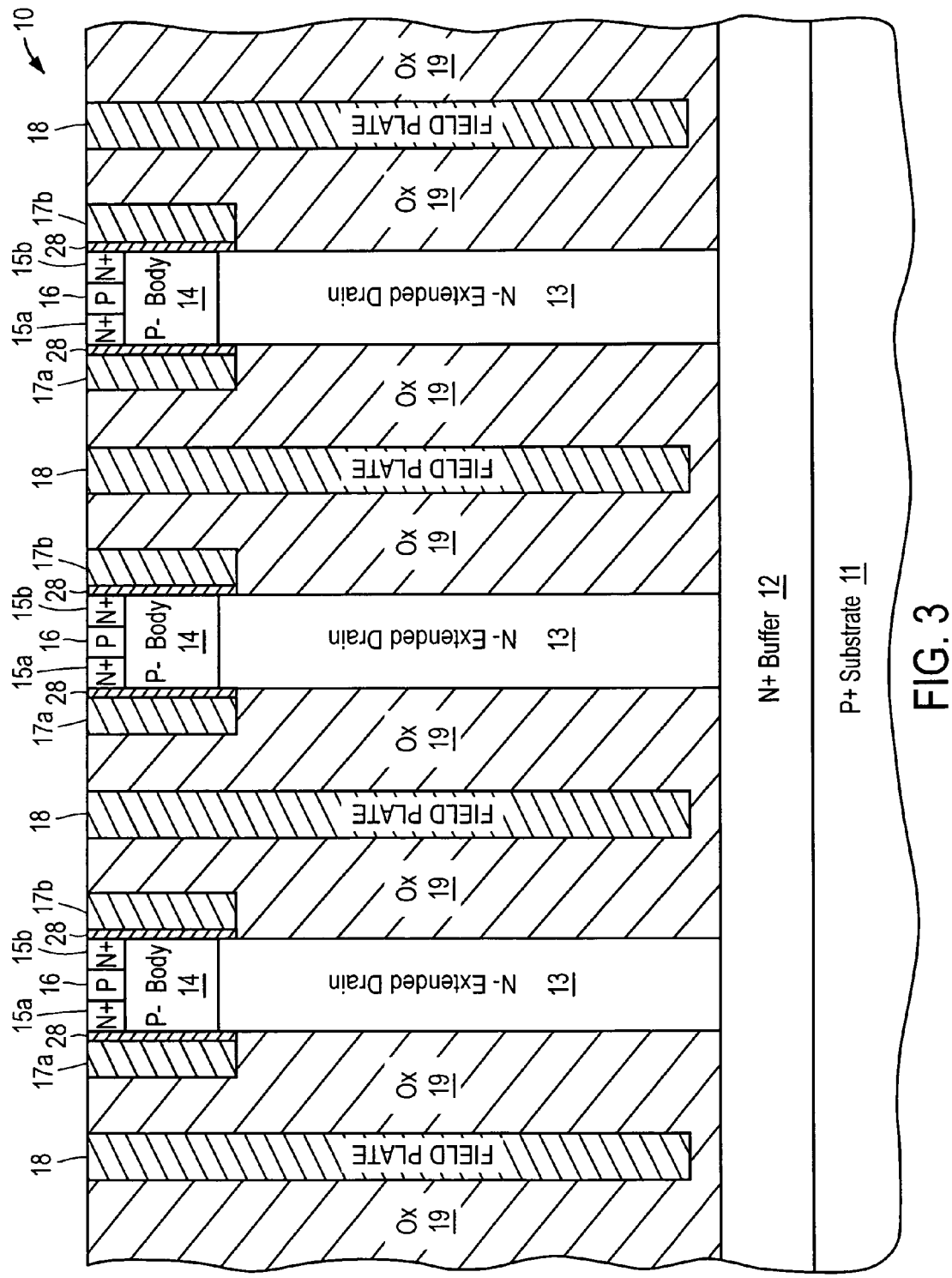
FIG. 3 illustrates an example cross-sectional side view of another vertical thin silicon (VTS) insulated gate bipolar transistor (IGBT) structure.
Figure 4:
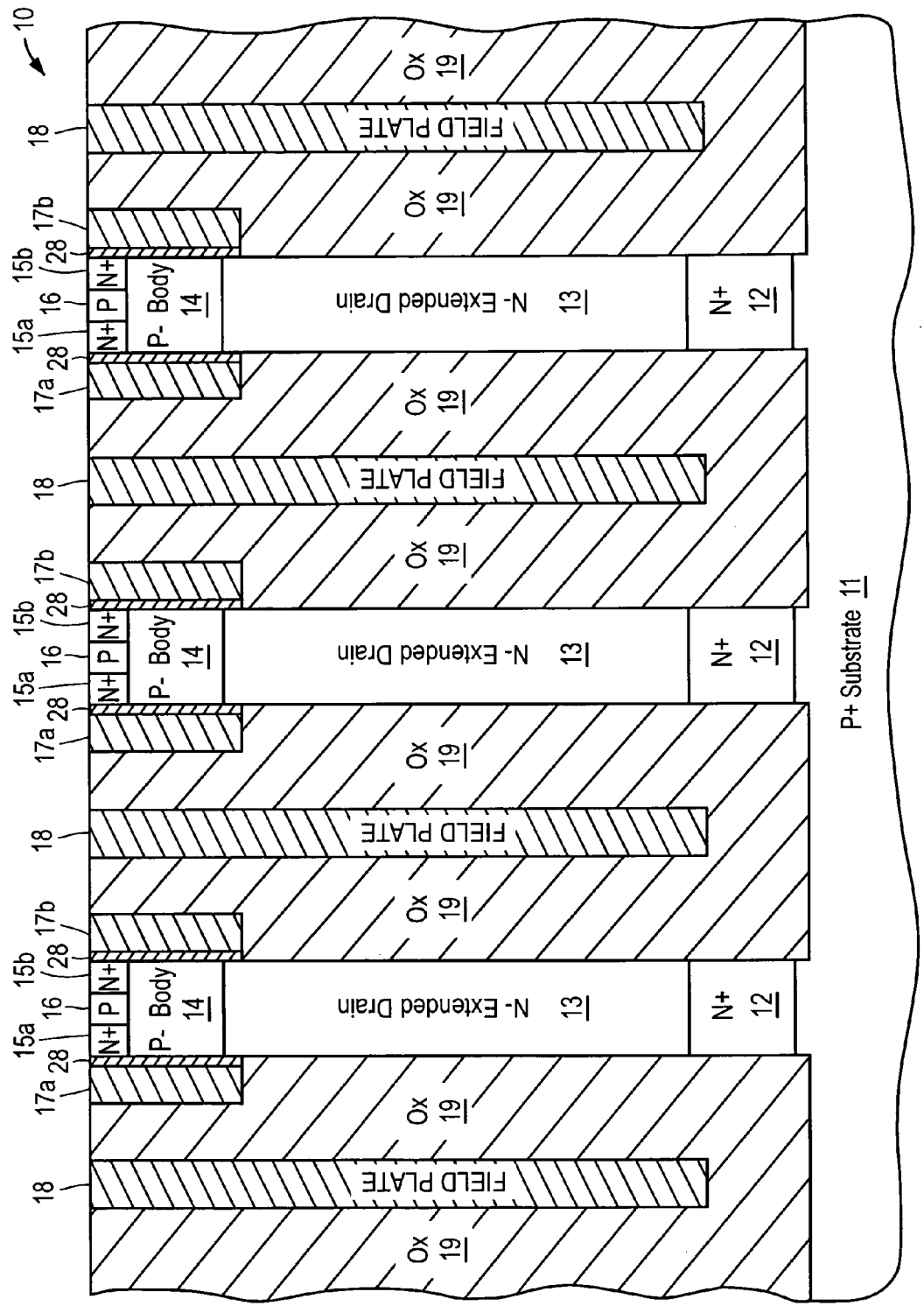
FIG. 4 illustrates an example cross-sectional side view of still another vertical thin silicon (VTS) insulated gate bipolar transistor (IGBT) structure.

In another embodiment shown in FIG. 3, dielectric regions 19 may extend from just beneath gate 17 vertically down substantially through the entire vertical thickness of drift regions 13, but stopping just short of N+ buffer layer 12. FIG. 4 shows still another embodiment in which dielectric regions 19 extend in the vertical direction from at least just beneath the body region down into the substrate.

Disposed within each of the dielectric regions 19, and fully insulated from N+ buffer 12, P+ substrate 11 and the adjoining semiconductor pillars, is a field plate 18. The conductive material used to from field plates 18 may comprise a heavily doped polysilicon, a metal (or metal alloys), a silicide, or other suitable conductive materials. In the completed device structure, field plates 19 normally function as capacitive plates that may be used to deplete the extended drain region of charge when the VTS IGBT is in the off-state (i.e., when the drain is raised to a high voltage potential). The field plate members may be connected to a field plate electrode at a certain location out of the plane of the figure.

In one embodiment, the lateral thickness of dielectric (oxide) region 19 that separates each field plate 19 from the sidewall of each adjoining pillar (extended drain region 13) is approximately 4 μm. Field plates 19 may be fabricated as narrow as can be reliably manufactured, since the field plate members occupy silicon area without directly contributing to device conductivity or breakdown voltage characteristics. In one embodiment, the width of field plates 18 is approximately 0.5 um-3.0 um.

Persons of skill in the art will understand that during forward (on-state) conduction, the resistance of N− drift regions 13 is considerably reduced by injection of minority carriers (holes) from P+ emitter layer 11 of the bipolar device into drift regions 13. These injected minority carriers typically take time to enter and exit (recombine) drift regions 13 when switching the VTS IGBT on and off. In the example device structures shown in FIG. 1, recombination (also referred to as "lifetime killing") of minority carriers is accomplished through the numerous interface traps created along the large sidewall region formed by the interface of N− drift regions 13 with dielectric (e.g., oxide) regions 19. For instance, when the device is switched from the on-state (forward conduction) to the off-state (blocking voltage) the interface traps along the sidewall areas of N− drift regions 13 effectively aid in rapidly sweeping out the minority carriers from drift regions 13, thereby improving high speed switching performance of the device. During turn-off, the presence of field plates 18 coupled to ground also helps to attract minority carriers present in drift regions 13 to the interface traps located along the sidewall areas.

In the example of FIG. 1 field plates 19 may be coupled to the lowest chip potential, e.g., ground. The source may also be tied to the field plates (at the lowest chip potential), or, alternatively, the source region may be left floating. In other words, the embodiment of FIG. 1 is not limited to a source follower configuration. The VTS IGBT device structure shown may be implemented as a four-terminal device, wherein the drain (emitter), source (collector), field plates, and insulated gate members are each connected to a separate circuit terminal. In another embodiment, the field plates and insulated gate members may be connected together.

In the off-state, a high voltage (e.g., 600V-800V, or higher) is applied across the respective drain (emitter) region 11 and source and collector regions, 15 & 16, respectively. As the voltage increases, the presence of field plate regions 18 on opposite sides of drift regions 13 cause the N-type drift regions to become depleted of free carriers. The doping profile in the drift regions 13 may be tailored such that the resulting electric field is approximately constant along the path from the drain to the source. In one embodiment, the doping concentration of epitaxial layer 13 is linearly graded to produce an extended drain region that exhibits a substantially uniform electric-field distribution. For example, the doping concentration may be highest near the N+ buffer layer 12, lowest the near the P-body regions 14, and linearly graded in between. In other embodiments, the doping profile gradient in the drift regions 13 varies (i.e., a different slope) as a function of the vertical depth of the drift region. In other words, the doping profile gradient may be steepest nearest to the bottom of drift regions 13 and shallowest near the P-body regions 14.

Each of FIGS. 2A-2F is a cross-sectional side views that illustrates an example VTS IGBT structure taken at various stages in an example fabrication process. This fabrication process shown by these figures may be used to form the device of FIG. 1. The process starts with FIG. 2A, which illustrates an example cross-sectional side view of a VTS IGBT structure in a fabrication process after the initial step of forming N-doped layers 12 and 13 over a P+ silicon substrate 11. In one embodiment, N+ buffer layer 12 has a vertical thickness in a range about 10-15 μm thick. The N+ buffer layer 12 is heavily doped to minimize its resistance to current flowing through to the drain (emitter) electrode, which is located on the bottom of P+ substrate 11 in the completed device. Heavy doping of N+ buffer layer 12 also prevents punchthough to P+ substrate 11 during reverse bias voltage blocking. Doping of N+ buffer layer 12 may be carried out as N+ buffer layer 12 is being formed. Doping of N− epitaxial layer 13 may also be carried out as N− epitaxial layer 13 is being formed.

Figure 2A:
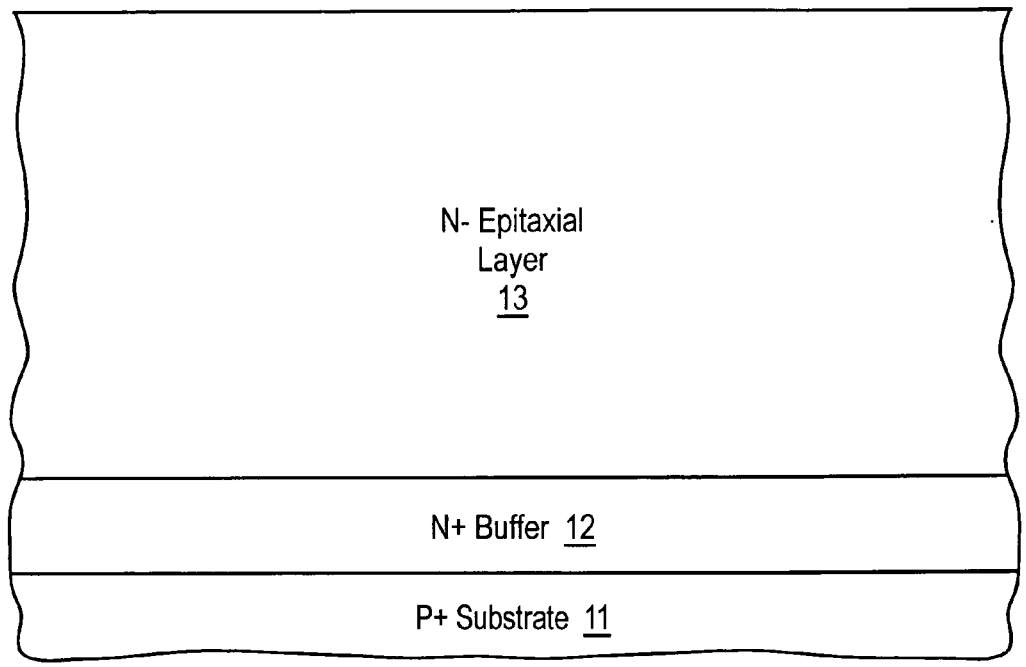
FIG. 2A illustrates an example cross-sectional side view of a VTS IGBT structure in a fabrication process after the initial step of forming N-doped epitaxial layers on a P+ substrate.
Figure 2B:
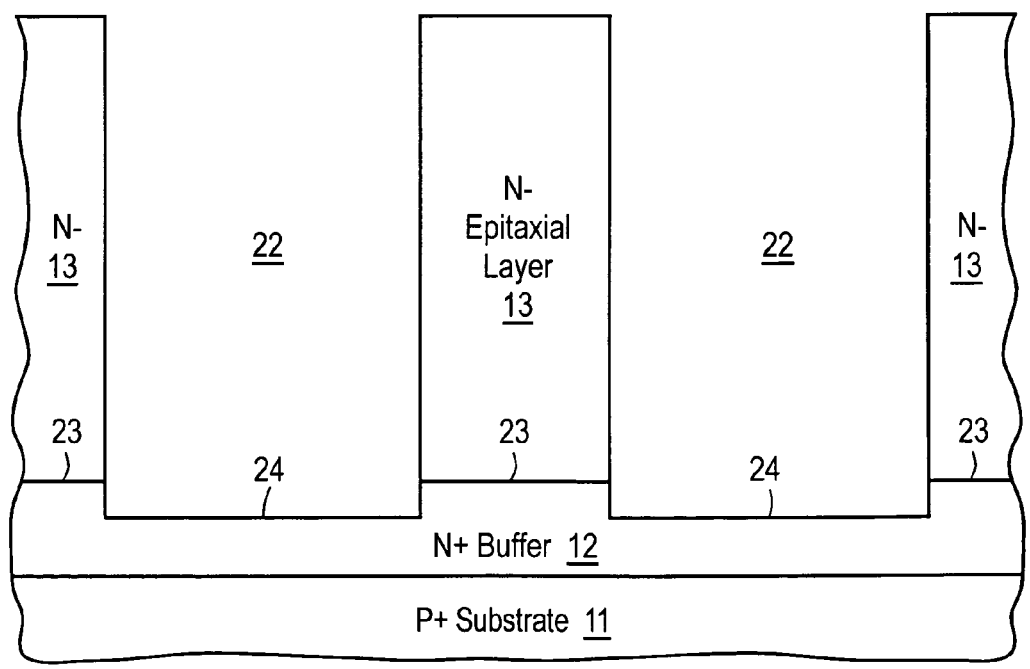
FIG. 2B illustrates the example device structure of FIG. 2A following vertical deep trench etching.

After layers 12 & 13 have been formed, the top surface of the semiconductor wafer is appropriately masked and deep vertical trenches 22 are then etched into N− epitaxial layer 13. FIG. 2B illustrates an example cross-sectional side view of a VTS IGBT in a fabrication process following vertical trench etching that forms silicon pillars or mesas of N-doped semiconductor material segregated by deep trenches 22. The height and width of each pillar, as well as the spacing between adjacent vertical trenches 22 may be determined by the breakdown voltage requirements of the device. As described previously, these segregated pillars of epitaxial material 13 eventually form the N-type extended drain or drift regions of the final deep trench IGBT device structure.

It should be understood that each pillar, in various embodiments, may extend a considerable lateral distance in an orthogonal direction (into and out of the page). In certain embodiments, the lateral width of the N-type drift region formed by each pillar is as narrow as can be reliably manufactured in order to achieve a very high breakdown voltage (e.g., 600-800V).

Furthermore, it should be understood that although the example of FIG. 1 illustrates a cross section having three pillars or columns of semiconductor material that includes three segregated N− drift regions, it should be understood that this same device structure may be repeated or replicated many times in both lateral directions over the semiconductor die in a completely fabricated device. Other embodiments may optionally include additional or fewer semiconductor regions. For example, certain alternative embodiments may comprise a drift region with a doping profile that varies from top to bottom. Other embodiments may include multiple abrupt (i.e., stepped) variations in lateral width of the semiconductor material that forms the segregated pillars (e.g., N− drift regions). For instance, drift regions 13 may be fabricated wider near the top surface of the silicon wafer and narrower nearest the N+ buffer layer 12.

Figure 2C:
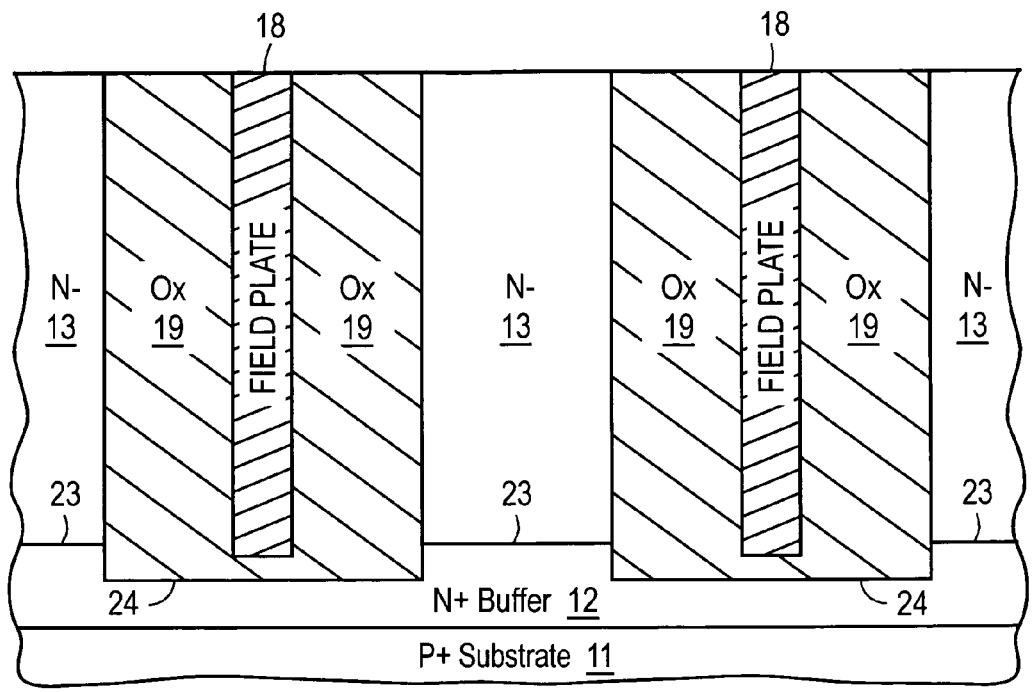
FIG. 2C illustrates the example device structure of FIG. 2B after formation of a dielectric regions and field plates that fill the deep vertical trenches.

FIG. 2C illustrates the example device structure of FIG. 2B after formation of the dielectric regions and field plates that fill the deep vertical trenches. These steps may be carried out in a variety of different processing sequences. In one embodiment, a dielectric layer 19 is first formed on the sidewalls of N-epi pillars 13 and also covering N+ buffer layer 12 at the bottom of the trench. This is followed by subsequent filling of the remaining portions of the trenches with polysilicon or another suitable conductive material to form field plates 18. The dielectric layer preferably comprises silicon dioxide, though silicon nitride or other suitable dielectric materials may also be used. In this example, oxide region 19 covers opposing sidewalls of a pair of adjoining pillars 13 that are separated by a single deep trench 22. The sidewall oxide regions 19 cover the exposed portion of N-epi regions (pillars) 13 in each of the respective trenches. Oxide regions 19 may be formed using a variety of well-known methods, including thermal growth and chemical vapor deposition.

Alternatively, each of the trenches 22 may be filled completely with dielectric material (e.g., oxide) followed by masking and etching steps to open a trench that is subsequently filled with a conductive material that forms field plates 18.

As shown in FIG. 2C, dielectric regions 19 cover the sidewalls of each of the epitaxial layer pillars. Field plates 18 and dielectric regions 19 completely fill each of the trenches 22. Field plates 18 extend down from the top surface of the wafer along the full height of N− epitaxial layer 13. Following formation of regions 19, the top surface of the silicon substrate may be planarized utilizing conventional techniques such as chemical-mechanical polishing.

Figure 2D:
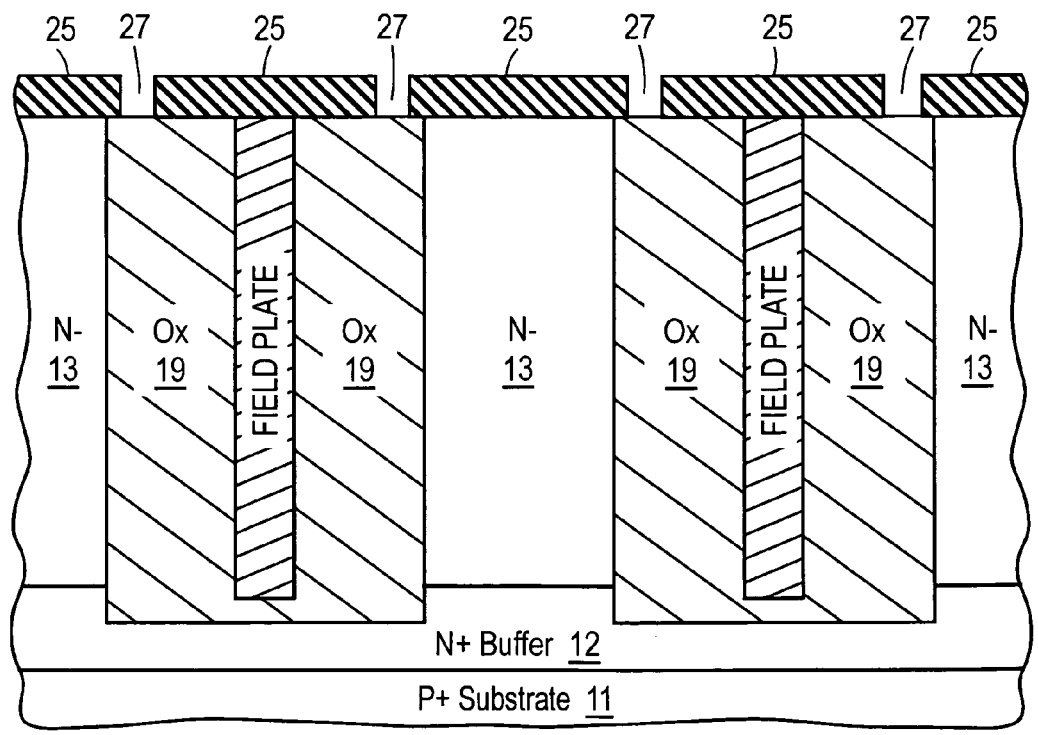
FIG. 2D illustrates the example device structure of FIG. 2C after masking of a top surface of the silicon substrate and a first etch of the underlying dielectric regions.

FIG. 2D illustrates the example device structure of FIG. 2C after masking of a top surface of the silicon substrate. In this example, the masking layer 25 comprises a layer of photoresist with developed openings 27 over oxide regions 19. Note that the portion of masking layer 25 directly above each pillar of epitaxial region 13 extends or overlaps a short distance beyond the edge of the sidewall portion of the pillar. This has the effect of leaving a thin layer of sidewall oxide that covers first and second sidewall portions of oxide regions 19. That is, the edge of each opening 27 closest to each N-epi pillar 13 is not coincident with the sidewall; rather, openings 27 are intentionally offset so that the nearest edge of each opening 27 is a small distance away from the corresponding pillar sidewall. In one embodiment, the overlap distance is approximately 0.2 μm to 0.5 μm.

Gate trenches 26 are formed by a first dielectric etch that removes the dielectric material of regions 19 in the areas directly below openings 27. In one embodiment, the first dielectric etch is a plasma etch that is substantially anisotropic. The first dielectric etch is performed down to the desired or target depth, which is about 3 μm deep in one embodiment. A mixture of $C_4F_8/CO/Ar/O_2$ gases, for example, may be utilized for the plasma etch. Note that the anisotropic nature of the first etch produces a substantially vertical sidewall profile in the gate trench that does not extend or penetrate to the sidewalls of each pillar 13. Stated differently, the overlap distance of masking layer 25 is such that anisotropic etching through openings 27 does not attack the sidewalls of N-epi pillars 13; instead, a portion of the dielectric material comprising oxide regions 19 still remains covering the sidewall areas of pillars 13 after the first dielectric etch.

Figure 2E:
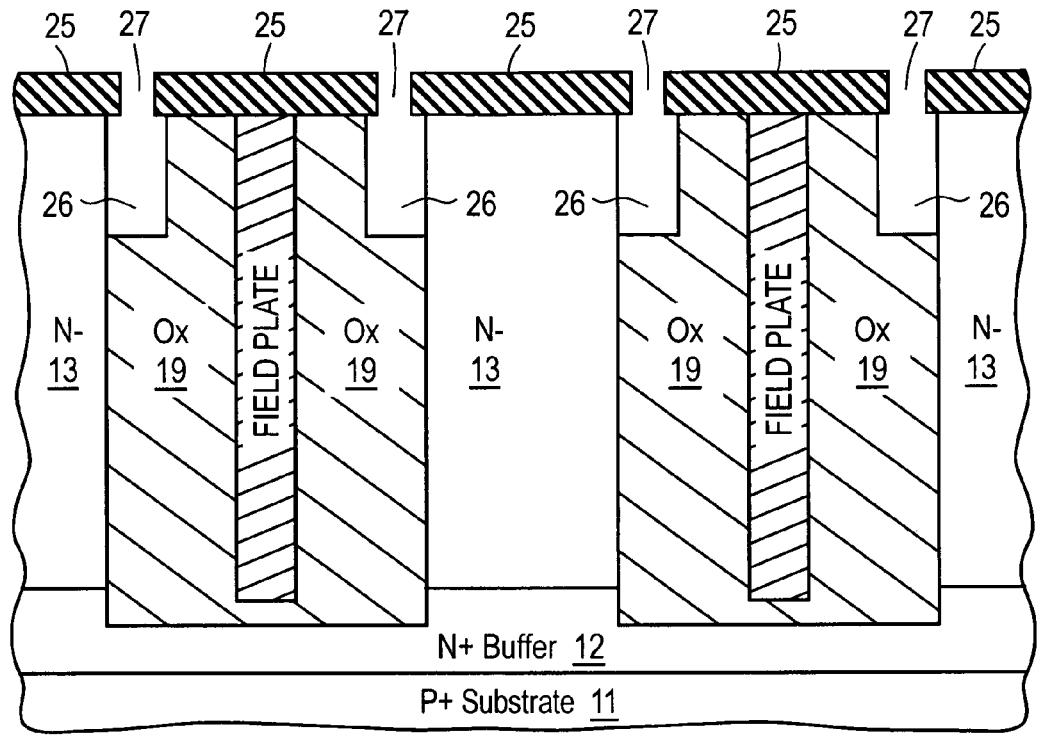
FIG. 2E illustrates the example device structure of FIG. 2D after a second dielectric etch that forms the gate trenches.

FIG. 2E illustrates the example device structure of FIG. 2D following removal of the oxide covering the sidewalls of N-epi pillars 13 in the gate trenches. A second dielectric etch may be performed through openings 27 of masking layer 25 to completely remove the remaining oxide on the sidewalls of the N-epi pillars. In one embodiment, the second dielectric etch is a wet etch (e.g., using buffered HF) that is substantially isotropic in nature. The result is a pair of gate trenches 26 that expose the epitaxial silicon material along the sidewalls of each pillar or mesa.

In the embodiment shown, the second dielectric etch is highly selective, which means that it etches the dielectric material at a much faster rate than it etches silicon. Using this process, the silicon surface of each sidewall is undamaged, thereby allowing a high-quality gate oxide to be subsequently grown on the sidewall surface. In addition, due to the substantially isotropic nature of the second dielectric etch the gate trench is etched at a similar rate in both the vertical and lateral directions. However, as the second dielectric etch is utilized to remove the remaining few tenths of a micron of silicon dioxide on the silicon mesa sidewall, the overall effect on the aspect ratio of trench gate openings 27 is relatively insignificant. In one embodiment, the lateral width of each gate trench opening 27 is approximately 1.5 µm wide, and the final depth is approximately 3.5 µm.

Figure 2F:
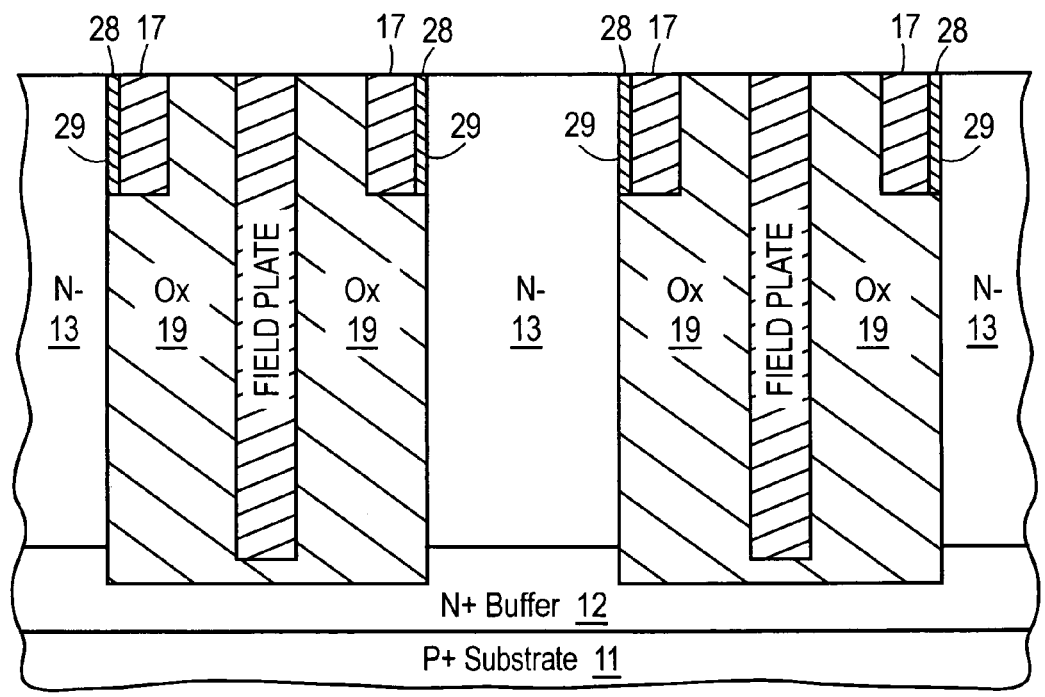
FIG. 2F illustrates the example device structure of FIG. 3E following formation of the trench gate structure in the gate trenches.

FIG. 2F illustrates the example device structure of FIG. 2E after removal of the masking layer 25, formation of a high-quality, thin (e.g., ~500 Å) gate oxide layer 28, which covers the exposed sidewalls portions of N-epi pillar 13, and subsequent filling of the gate trenches. In one embodiment, gate oxide layer 28 is thermally grown with a thickness in the range of 100 to 1000 Å. Masking layer 25 is removed prior to formation of gate oxide 28. The remaining portion of each gate trench is filled with doped polysilicon or another suitable material, which form gate members 17 in the completed VTS IGBT device structure. In one embodiment, each gate member 17 has a lateral width of approximately 1.5 µm and a depth of about 3.5 µm.

Practitioners in the art will appreciate that the overlap distance of the masking layer should be sufficiently large enough such that even under a worst-case mask misalignment error scenario, the resulting overlap of masking layer 25 with respect to the sidewall of each N-epi pillar 13 still prevents the plasma etch from attacking the silicon material along either one of opposing pillar sidewalls. Similarly, the overlap distance of masking layer 25 should not be so large such that in a worst-case mask misalignment scenario the oxide remaining on either one of sidewalls 19 cannot be removed by a reasonable second dielectric etch. If, for example, the overlap distance happens to be too large, the second dielectric etch needed to remove the oxide covering the sidewall portions of N-epi pillars 13 might result in excessive thinning of the oxide remaining between (i.e., separating) gate members 17 and field plates 18, potentially leading to inadequate isolation between these elements.

Formation of the N+ source (collector) regions 15 & 16, and P-body region 14 near the top of each N– drift region 13 may occur after the trench gate structure has been completed. Source regions 15, collector region 16, and P-body region 14 may each be formed using ordinary deposition, diffusion, and/or implantation processing techniques. After formation of the N+ source regions 15, the transistor device may be completed by forming source (collector), drain (emitter), field plate, and MOSFET gate electrodes that electrically connect to the respective regions/materials of the device using conventional fabrication methods (not shown in the figures for clarity reasons).

Although the above embodiments have been described in conjunction with a specific device types, those of ordinary skill in the arts will appreciate that numerous modifications and alterations are well within the scope of the present invention. For instance, although various VTS IGBTs have been described, the methods, layouts and structures shown are equally applicable to other structures and device types, including Schottky, diode, MOS and bipolar structures. Accordingly, the specification and drawings are to be regarded in an illustrative rather than a restrictive sense.

We claim:

1. A power transistor device comprising:
   a substrate of a first conductivity type;
   a buffer layer of a second conductivity type opposite to the first conductivity type, the buffer layer being disposed on top of the substrate with a first PN junction being formed between the substrate and the buffer layer;
   a plurality of pillars of semiconductor material, each pillar including:
   a first region of the second conductivity type;
   a second region of the first conductivity type disposed adjacent to the first region;
   a body region of the first conductivity type, the body region adjoining both the first and second regions;
   a drift region of the second conductivity type that extends in a vertical direction from the body region to the buffer layer, a second PN junction being formed between the body region and the drift region;
   adjoining pairs of the pillars being separated in a lateral direction by a dielectric region that extends in the vertical direction from at least just near to the second PN junction down at least into the buffer layer, the dielectric region forming a sidewall interface with each drift region of the adjoining pairs of the pillars;
   a field plate member disposed within the dielectric region, the field plate member having a length that extends in the vertical direction, the field plate member being formed of a conductive material that is fully insulated from the drift region and the buffer layer;
   a trench gate disposed in the dielectric region adjacent to the body region, the gate being insulated from the body region and the field plate member;
   wherein when the power transistor device is in an on-state, the first and second PN junctions operate as a bipolar transistor with the substrate comprising an emitter, the second region comprising a collector, and the trench gate functioning as a control input of a field-effect transistor (FET) that controls forward conduction between the emitter and collector, when the power transistor device is in an off-state, the first PN junction being reversed-biased.

2. The power transistor device of claim 1 wherein the field plate member extends from adjacent a top surface of the first region downward to substantially adjacent a top surface of the buffer layer.

3. The power transistor device of claim 1 further comprising a gate disposed within the first and second dielectric regions adjacent the body region, the gate being insulated from the body region and the first and second field plates.

4. The power transistor device of claim 1 wherein the drift region has a linearly graded doping profile in the vertical direction.

5. The power transistor device of claim 1 wherein the first conductivity type comprises p-type and the second conductivity type comprises n-type.

6. The power transistor device of claim 1 wherein the field plate member comprises heavily doped polysilicon.

7. The power transistor device of claim 1 wherein the dielectric region comprises silicon dioxide.

8. The power transistor device of claim 1 wherein the dielectric region extends in the vertical direction down into the buffer layer.

9. The power transistor device of claim 1 wherein the dielectric region extends in the vertical direction down into the substrate.

10. The power transistor device of claim 1 wherein the buffer layer has a doping concentration that is sufficiently high so as to prevent punchthrough to the substrate when the power transistor device operates in the off-state.

11. The power transistor device of claim 1 further comprising a first common electrode of a drain of the FET and the emitter of the bipolar transistor, the first common electrode being disposed on a bottom of the substrate.

12. The power transistor device of claim 1 wherein the sidewall interface provides interface traps adjacent the drift region.

* * * * *